(12) United States Patent
Herrmann et al.

(10) Patent No.: US 9,076,898 B2
(45) Date of Patent: Jul. 7, 2015

(54) CARRIER FOR AN OPTOELECTRONIC STRUCTURE COMPRISING A STRUCTURED ELECTRONICALLY CONDUCTIVE LAYER AT THE TOP SIDE OF MAIN BODY, AND OPTOELECTRONIC SEMICONDUCTOR CHIP COMPRISING SUCH A CARRIER

(75) Inventors: Siegfried Herrmann, Neukirchen (DE); Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/002,109

(22) PCT Filed: Jan. 23, 2012

(86) PCT No.: PCT/EP2012/050982
§ 371 (c)(1),
(2), (4) Date: Nov. 15, 2013

(87) PCT Pub. No.: WO2012/116858
PCT Pub. Date: Sep. 7, 2012

(65) Prior Publication Data
US 2014/0054635 A1 Feb. 27, 2014

(30) Foreign Application Priority Data
Mar. 3, 2011 (DE) .......................... 10 2011 012 924

(51) Int. Cl.
*H01L 31/00* (2006.01)
*H01L 33/00* (2010.01)
*H01L 31/02* (2006.01)
(Continued)

(52) U.S. Cl.
CPC ........ *H01L 31/02002* (2013.01); *H01L 33/382* (2013.01); *H01L 33/486* (2013.01); *H01L 33/62* (2013.01); *H05K 1/113* (2013.01); *H05K 3/3436* (2013.01); *H05K 2201/09781* (2013.01); *H05K 2201/10121* (2013.01); *H05K 1/0203* (2013.01); *H05K 1/0306* (2013.01); *H05K 1/05* (2013.01); *H05K 2201/09845* (2013.01); *H05K 2201/10106* (2013.01); *H05K 1/11* (2013.01); *H01L 2924/0002* (2013.01); *H01L 31/02005* (2013.01)

(58) Field of Classification Search
CPC ................... H01L 31/02005; H01L 31/02002; H01L 33/62; H01L 33/486; H01L 33/382
See application file for complete search history.

(56) References Cited

U.S. PATENT DOCUMENTS

2007/0058059 A1 3/2007 Suehiro
2007/0096130 A1 5/2007 Schiaffino et al.
(Continued)

FOREIGN PATENT DOCUMENTS

CN 101529585 A 9/2009
DE 10 2007 030 129 A1 1/2009
(Continued)

*Primary Examiner* — Ngan Ngo
(74) *Attorney, Agent, or Firm* — McDermott Will & Emery LLP

(57) ABSTRACT

A carrier (1) for an optoelectronic structure (2) is specified, wherein in places an electrically insulating passivation material (16) is arranged between an electrically conductive layer (14) of the carrier (1) and a carrier-side connecting means layer (15). Furthermore, an optoelectronic semiconductor chip comprising such a carrier and an optoelectronic structure (2) is specified, said structure being electrically conductively and mechanically connected to the carrier (1) by means of the carrier-side connecting means layer (15).

12 Claims, 2 Drawing Sheets

(51) Int. Cl.
  *H01L 33/38* (2010.01)
  *H01L 33/48* (2010.01)
  *H01L 33/62* (2010.01)
  *H05K 1/02* (2006.01)
  *H05K 1/03* (2006.01)
  *H05K 1/11* (2006.01)
  *H05K 3/34* (2006.01)
  *H05K 1/05* (2006.01)

(56) References Cited

U.S. PATENT DOCUMENTS

2008/0035935 A1 2/2008 Shum
2008/0315230 A1 12/2008 Murayama
2009/0173956 A1 7/2009 Aldaz et al.
2009/0179207 A1* 7/2009 Chitnis et al. .................. 257/88
2010/0171135 A1 7/2010 Engl et al.
2010/0207152 A1 8/2010 Won
2011/0005822 A1 1/2011 Momokawa
2012/0181568 A1* 7/2012 Hsia et al. ....................... 257/99

FOREIGN PATENT DOCUMENTS

| | | |
|---|---|---|
| DE | 10 2007 062 046 A1 | 6/2009 |
| DE | 10 2008 054 235 A1 | 5/2010 |
| DE | 10 2009 032 486 A1 | 1/2011 |
| EP | 1450417 A1 | 8/2004 |
| TW | 200939546 A | 9/2009 |
| WO | 2004/105142 A1 | 12/2004 |
| WO | 2009/077974 A2 | 6/2009 |

* cited by examiner

CARRIER FOR AN OPTOELECTRONIC STRUCTURE COMPRISING A STRUCTURED ELECTRONICALLY CONDUCTIVE LAYER AT THE TOP SIDE OF MAIN BODY, AND OPTOELECTRONIC SEMICONDUCTOR CHIP COMPRISING SUCH A CARRIER

A carrier for an optoelectronic structure is specified. Furthermore, an optoelectronic semiconductor chip comprising such a carrier is specified.

One object to be achieved is to specify a carrier for an optoelectronic structure which makes possible a particularly stable optoelectronic semiconductor chip.

In accordance with at least one embodiment of the carrier, the carrier is suitable as a carrier for an optoelectronic structure. The optoelectronic structure can be for example a structure which comprises a semiconductor layer sequence. The semiconductor layer sequence preferably comprises at least one active region suitable for generating and/or detecting electromagnetic radiation during the operation of the optoelectronic structure. The carrier and the optoelectronic structure can together form an optoelectronic semiconductor chip, which can then be for example a light-emitting diode chip or a photodiode chip.

In accordance with at least one embodiment of the carrier, the carrier comprises an electrically insulating main body. The electrically insulating main body forms the mechanically supporting component of the carrier. By way of example, the electrically insulating main body is embodied in the manner of a plate, that is to say that its extent in a lateral direction is greater than its thickness in the vertical direction perpendicular thereto. The electrically insulating main body is formed with an electrically insulating material or with electrically insulating materials. By way of example, the electrically insulating main body can contain one of the following materials or consist of one of the following materials: silicon, in particular undoped silicon, ceramic materials, in particular ceramic materials such as aluminum nitride, aluminum oxide.

In principle, it is also possible to use a non-electrically insulating main body. In this case, a correct electrical function is ensured by suitable insulation layers of the metallizations (including vias) with respect to the main body.

In accordance with at least one embodiment of the carrier, the carrier comprises at least one n-side connection location at an underside of the main body. Via the n-side connection location, an electric current can be impressed into an optoelectronic structure fixed to the carrier. The n-side connection location is then for example the cathode of an optoelectronic semiconductor chip comprising said carrier.

The n-side connection location can be embodied for example as a metallization, that is to say for example as a metal layer, at the underside of the main body.

In accordance with at least one embodiment of the carrier, the carrier has a p-side connection location arranged at the underside of the main body. The p-side connection location can be for example the anode of an optoelectronic semiconductor chip having the carrier. Like the n-side connection location, the p-side connection location can be embodied as a metallization at the underside of the main body and is electrically insulated from the n-side connection location. By way of example, in this way the carrier is suitable for surface mounting by means of the n-side connection locations and the p-side connection locations of the carrier being connected for example to the contact locations of a printed circuit board on which the carrier is arranged.

In accordance with at least one embodiment of the carrier, the carrier comprises a structured electrically conductive layer at the top side of the main body situated opposite the underside. The structured electrically conductive layer is preferably electrically conductively connected to the p-side connection locations and the n-side connection locations of the carrier. Via the structured electrically conductive layer, the current impressed through the connection locations is distributed along the top side of the carrier or conducted to the desired locations.

In accordance with at least one embodiment of the carrier, the carrier comprises a structured and electrically conductive carrier-side connecting means layer at that side of the structured electrically conductive layer which faces away from the main body. The connecting means layer is for example a solder layer or a layer composed of conductive adhesive. The carrier-side connecting means layer is arranged at that side of the structured electrically conductive layer which faces away from the main body, and is connected thereto directly in places and only indirectly in places.

In accordance with at least one embodiment of the carrier, the structured electrically conductive layer is electrically conductively connected to the n-side connection location in a first region and electrically conductively connected to the p-side connection location in a second region, wherein the first region and the second region are electrically insulated from one another. In other words, the structured electrically conductive layer has at the top side of the main body at least two regions which are connected to connection locations of the carrier having different polarities. If the carrier comprises a plurality of n-side connection locations, preferably all the n-side connection locations are connected to a first region. If the carrier comprises a plurality of p-side connection locations for a single optoelectronic structure, preferably all the p-side connection locations are connected to a second region.

In this case, it is possible for the carrier to have a plurality of first regions and a plurality of second regions or exactly one first region and exactly one second region.

If the carrier is provided for example for carrying two or more optoelectronic structures, then it can comprise a number of n-side connection locations, of p-side connection locations, of first regions of the structured and electrically conductive layer and of second regions of the structured and electrically conductive layer, which number corresponds to the number of optoelectronic structures. The first and second regions of the structured electrically conductive layer therefore conduct and distribute the current from the connection locations of the carrier having different polarities in a predeterminable manner at the top side of the main body.

In accordance with at least one embodiment of the carrier, the carrier-side connecting means layer is in direct contact with the electrically conductive layer in places, and in places an electrically insulating passivation material is arranged between the electrically conductive layer and the carrier-side connecting means layer. That is to say that there are regions in which the carrier-side connecting means layer is electrically conductively connected to the electrically conductive layer, and there are regions in which the carrier-side connecting means layer is only mechanically connected to the electrically conductive layer, wherein the mechanical connection is imparted by the electrically insulating passivation material. As a result, it is possible, in particular, for the passivation material to be arranged at that side of the electrically conductive layer which faces away from the carrier body and at that side of the carrier-side connection means layer which faces the carrier, that is to say to run in particular directly between these two layers.

The structured electrically conductive connecting means layer is thereby subdivided into regions which are in direct electrical contact with one of the connection locations of the carrier, and into regions which are electrically insulated from the connection locations—at least with regard to the connection via the structured electrically conductive layer. In this case, it is possible, in particular, for the carrier to have a uniform thickness in the context of production tolerance. That can be achieved for example by virtue of the fact that the structured connecting material, where no passivation material is arranged between the connecting material and the electrically conductive layer, is embodied with a thickness such that it has a same thickness as the layer stack composed of passivation material and connecting material arranged on the passivation material.

In accordance with at least one embodiment of the carrier, the carrier for an optoelectronic structure comprises an, in particular electrically insulating, main body, at least one n-side connection location at an underside of the main body, at least one p-side connection location at the underside of the main body, a structured electrically conductive layer at the top side of the main body situated opposite the underside, and a structured and electrically conductive carrier-side connecting means layer at that side of the structured electrically conductive layer which faces away from the main body. In this case, the structured electrically conductive layer is electrically conductively connected to the n-side connection location in a first region, the structured electrically conductive layer is electrically conductively connected to the p-side connection location in a second region, and the first region and the second region of the electrically conductive layer are electrically insulated from one another. The carrier-side connecting means layer is in direct contact with the electrically conductive layer in places, and in places an electrically insulating passivation material is arranged between the electrically conductive layer and the carrier-side connecting means layer.

In this case, the carrier described here is based on the concept, inter alia, that the redistribution wiring, that is to say the electrical connection between spatially isolated contact locations, for example of the optoelectronic structure for which the carrier is provided, is not implemented in the optoelectronic structure but rather at the carrier itself. The carrier can be for example a wafer, for instance a silicon wafer, which has connection locations, structured electrically conductive layers and structured electrically conductive connecting means layers in the manner described.

The carrier wafer can be connected to a semiconductor wafer comprising a multiplicity of optoelectronic structures, for example, by means of aligned bonding. In this way, the carrier provides mechanical support, electrical connections and the required distribution of the electric current for the optoelectronic structures.

The carrier wafer with the multiplicity of optoelectronic structures can subsequently be singulated into individual optoelectronic semiconductor chips, of which each optoelectronic semiconductor chip comprises one or more optoelectronic structures which are mechanically fixedly and electrically conductively connected to an assigned carrier.

In other words, the carrier described here is suitable and provided for a connecting technique in the wafer assemblage. A multiplicity of optoelectronic structures while still present in the wafer assemblage can be applied to the carrier and electrically connected there.

Furthermore, a particularly stable semiconductor chip is made possible with the carrier described here. In this case, stable relates both to electrical stability (despite the high currents necessary in the optoelectronic structures for example in comparison with customary BGA (ball grid array) applications, where only small switching and/or signal currents are distributed) and to mechanical stability (despite the extremely thin residual thickness of the optoelectric structures after the removal of the growth substrate).

In accordance with at least one embodiment of the carrier, the passivation material is arranged in places between the electrically conductive layer and the carrier-side connecting means layer, wherein the passivation material is in direct contact with the electrically conductive layer and the connecting means layer. That is to say that in the regions in which passivation material is present, the passivation material imparts a mechanical connection between the carrier-side connecting means layer and the electrically conductive layer.

In accordance with at least one embodiment of the carrier, the passivation material is in direct contact with the electrically conductive layer exclusively in the first region. That is to say that the passivation material is preferably arranged only where the electrically conductive layer is electrically conductively connected to the n-side connection location. In the second region of the structured electrically conductive layer, that is to say where the structured electrically conductive layer is electrically conductively connected to the p-side connection location, the carrier-side connecting means layer is in direct contact with the electrically conductive layer. In other words, it is possible for the second region of the electrically conductive layer to be free of the passivation material.

In accordance with at least one embodiment, the second region of the structured electrically conductive layer is free of passivation material. Where the structured electrically conductive layer is electrically conductively connected to the p-side connection location, the carrier-side connecting means layer is in direct contact with the electrically conductive layer. The passivation material is arranged exclusively in the first region and is in direct contact with the electrically conductive layer only where no conductive connection of the carrier-side connecting means layer to the structured electrically conductive layer is desired.

In accordance with at least one embodiment of the carrier, the connection locations of the carrier are electrically conductively connected to the electrically conductive layer by means of in each case at least one via, wherein the vias extend through the main body from the underside to the top side of the main body. The vias therefore provide for the electrically conductive contact of the connection locations with the assigned regions of the electrically conductive layer. By way of example, the vias are formed by metallizations of holes in the main body which completely penetrate through the main body from its top side to its underside. In this case, said holes can also be completely filled with electrically conductive material, for example metal. By way of example, the vias are formed with the same material as the connection locations. That is to say that a via can be embodied integrally with the connection location assigned to it. At the top side of the main body, the vias are in direct contact with the assigned regions of the electrically conductive layer. In this case, the electrically conductive layer can likewise be formed from the same material as the vias and the connection locations, such that a region of the electrically conductive layer can be embodied integrally with the assigned vias and connection locations.

Furthermore, an optoelectronic semiconductor chip is specified. The optoelectronic semiconductor chip comprises a carrier as described here. That is to say that all features disclosed for the carrier are also disclosed for the optoelectronic semiconductor chip, and vice versa.

In accordance with at least one embodiment of the optoelectronic semiconductor chip, the carrier is electrically conductively and mechanically connected to an optoelectronic structure by means of the carrier-side connecting means layer.

That is to say that the optoelectronic semiconductor chip comprises an optoelectronic structure, which is electrically conductively and mechanically connected to the carrier by means of the carrier-side connecting layer.

In accordance with at least one embodiment of the optoelectronic semiconductor chip, the optoelectronic structure comprises the following components: the optoelectronic structure comprises a semiconductor layer sequence, which can be produced epitaxially, for example. The semiconductor layer sequence can be based on a III-V compound semiconductor material, for example. The semiconductor layer sequence comprises an active region provided for generating or detecting electromagnetic radiation during the operation of the semiconductor layer sequence. Furthermore, the semiconductor layer sequence comprises a p-type side, which is formed for example with a p-doped semiconductor material, and an n-type side, which is formed for example with an n-doped semiconductor material. The active region is then arranged between the p-type side and the n-type side.

The optoelectronic structure furthermore comprises a mirror layer, which is provided for reflecting electromagnetic radiation generated in the active region or electromagnetic radiation to be detected in the active region. In this case, the mirror layer is electrically conductively connected to the p-type side of the semiconductor layer sequence. The mirror layer is fitted to the semiconductor layer sequence and mechanically connected thereto for example at the p-type side of said semiconductor layer sequence. In this case, electric current for operating the active region can also be impressed into the p-type side of the semiconductor layer sequence via the mirror layer if the mirror layer is embodied in an electrically conductive fashion. By way of example, the mirror layer contains a reflective material such as gold or silver.

The optoelectronic structure furthermore comprises at least one structure-side via which makes electrically conductive contact with the n-type side of the semiconductor layer sequence and extends from the p-type side through the active region as far as the n-type side. That is to say that contact can be made with the active structure from the side at which the p-type side of the semiconductor layer sequence is arranged. A current distribution is not effected above the active region, for example on the outer area of the n-type side of the semiconductor layer sequence that faces away from the p-type side. Rather, a current distribution is already effected at the carrier in the present case. The carrier and the optoelectronic structure are connected to one another in such a way that the n-type side of the semiconductor layer sequence is situated in a manner facing away from the carrier.

In accordance with at least one embodiment of the optoelectronic semiconductor chip, the semiconductor chip comprises a structured and electrically conductive structure-side connecting means layer, which is in direct contact with the carrier-side connecting means layer, wherein the two connecting means layers are mechanically fixedly connected to one another. By way of example, the connecting means layers are solder layers or layers composed of conductive adhesive. In this case, the structure-side connecting means layer is electrically insulated from the semiconductor layer sequence for example at least in places by one or more structure-side passivation layers. In this case, the structure-side connecting means layer is arranged between the semiconductor layer sequence and the carrier.

In accordance with at least one embodiment of the optoelectronic semiconductor chip, the structure-side connecting means layer has at least one p-type region which is electrically conductively connected to the p-side connection location of the carrier, and at least one n-type region which is electrically conductively connected to the n-side connection location, wherein in a direction parallel to the main plane of extent of the active region the n-type regions of the structure-side connecting means layer and the mirror layer do not overlap or only scarcely overlap one another. "Scarcely overlap" means that at most 10% of the area of the mirror layer overlaps the n-type regions of the structure-side connecting means layer. Furthermore, the n-type regions of the structure-side connecting means layer and the mirror layer also do not overlap in a direction perpendicular to the main plane of extent of the active region. These components are therefore arranged in a manner offset with respect to one another vertically and laterally.

In this case, the optoelectronic semiconductor chip is based on the insight, inter alia, that a potential difference between the p-conducting mirror layer and the n-type regions of the structure-side connecting means layer can lead to undesired diffusion processes of, for example, material of the mirror layer in the optoelectronic semiconductor chip. The optoelectronic semiconductor chip described here makes it possible, however, for mirror layer and n-type regions of the structure-side connecting means layer not to overlap one another. A passivation layer between the connecting means layer and the mirror layer can therefore be made particularly thin, since the loading of the passivation layer on account of the potential difference is only low.

A further problem is electric field strength spikes that can lead to electric breakdowns of the passivation layer. These are additionally intensified with topography present or with the passivation being poorly formed over said topography. This is also avoided in the case of the optoelectronic semiconductor chip described here.

The carrier described here and the optoelectronic semiconductor chip described here are explained in greater detail below on the basis of exemplary embodiments and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
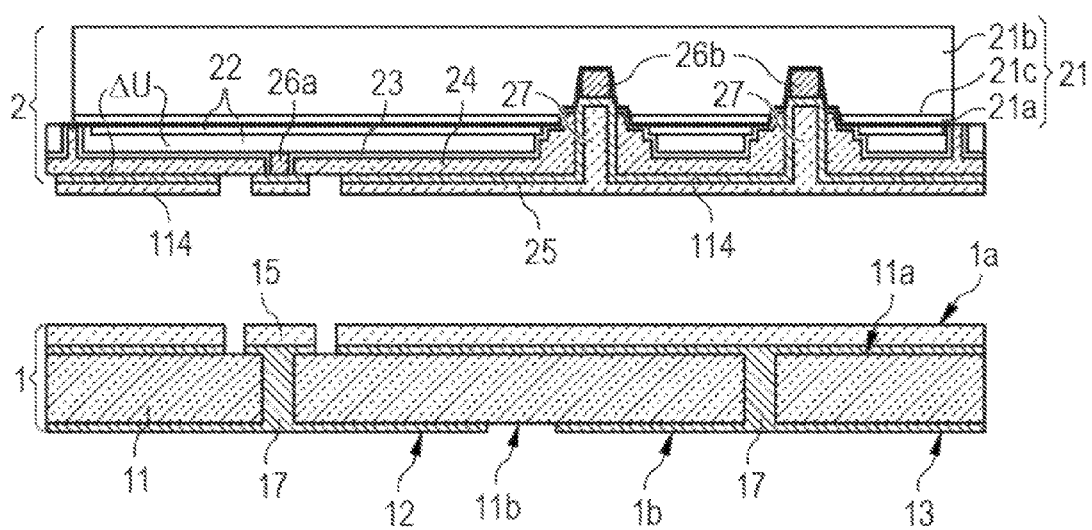
FIG. 1 shows, in a schematic sectional illustration, a carrier 1 for an optoelectronic structure 2 in accordance with an alternative embodiment.

FIG. 1 shows, in a schematic sectional illustration, a carrier 1 such as could be embodied as an alternative to the carrier described here. The carrier 1 comprises a main body 11, which is formed for example with an electrically insulating material such as undoped silicon or a ceramic material. Furthermore, it is possible for the main body 11 to be formed with an electrically conductive or semiconducting material. In this case, the main body comprises, if appropriate, suitable electrically insulating coatings.

At the underside 1b of the carrier, a p-side connection location 12 is applied to the underside 11b of the main body 1. The p-side connection location is electrically conductively connected to a region of a structured carrier-side connecting means layer 15 by means of the via 17. Furthermore, an n-side connection location 13 is applied at the underside 11b of the main body and is electrically conductively connected to a further region of the structured carrier-side connecting means layer 15 by means of the via 17. In the case of the carrier in accordance with FIG. 1, the connecting means layer 15 has only regions which are electrically conductively connected to one of the two connection locations. The connecting means layer 15 does not have electrically insulated regions. A wiring, that is to say an electrically conductive, in particular metallic connection, of spatially isolated contact locations therefore has to be effected within the optoelectronic structure 2. This is achieved there by means of the structured electrically conductive layer 114. In order that such a structured electrically conductive layer 114 can be applied at the underside of the optoelectronic structure facing the carrier 1, a relatively thick passivation layer 24 is necessary. What can disadvantageously arise in this case is that a potential difference ΔU that is ≠0 is formed between the mirror layer 22 and a part of the structured electrically conductive layer 114. This potential difference leads to an electrical loading of the passivation layers 23, 24 and can drive undesired diffusion processes in the semiconductor chip.

An exemplary embodiment of a carrier 1 described here with an optoelectronic structure 2 described here is described in greater detail in conjunction with the schematic sectional illustration in FIG. 2. The carrier 1 and the optoelectronic structure 2 jointly form an exemplary embodiment of an optoelectronic semiconductor chip described here.

Figure 2A:
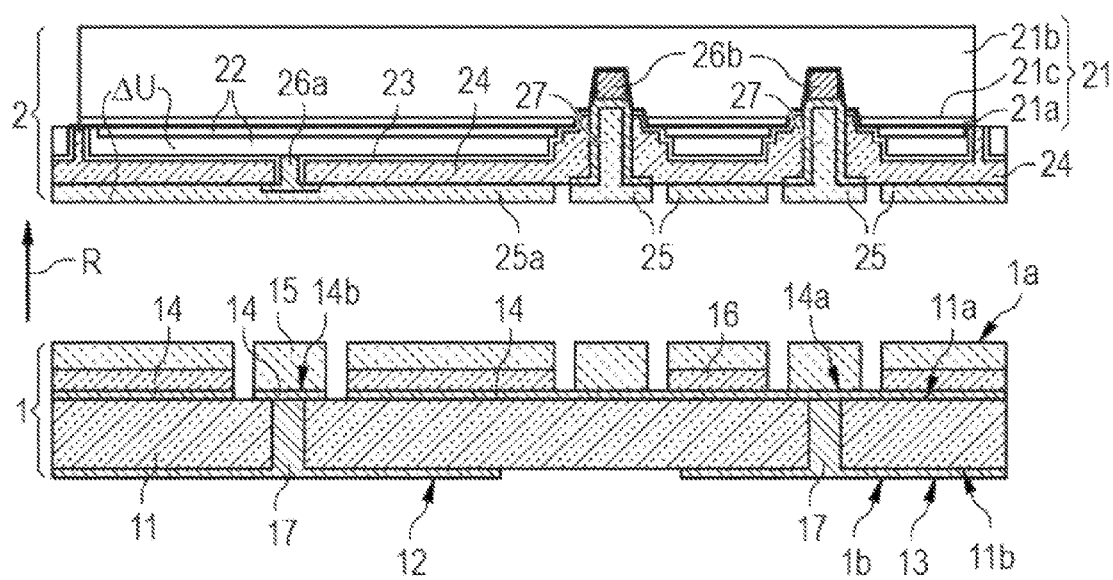
FIGS. 2A and 2B show, in schematic illustrations, an exemplary embodiment of a carrier described here and of an optoelectronic semiconductor chip described here.
Figure 2B:
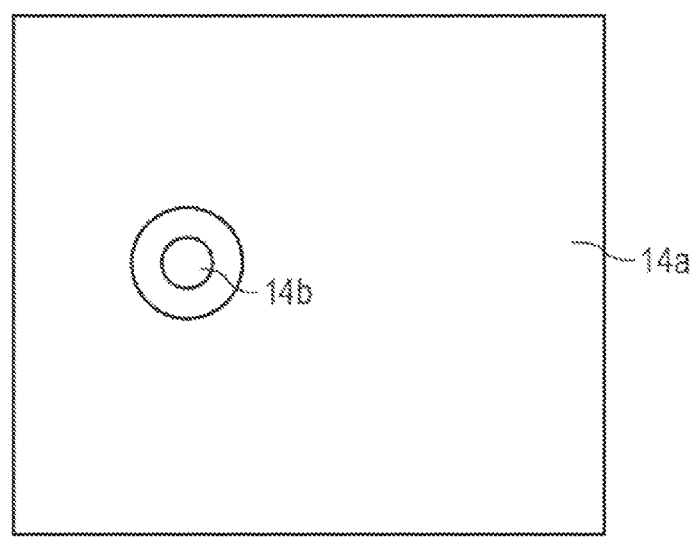

FIG. 2B shows a schematic plan view of a structured electrically conductive layer 14 at the top side 11 a of the main body 11 of the carrier 1.

In the present case, the carrier 1 comprises a main body 11 that is embodied in an electrically insulating fashion. The main body 11 consists for example of an electrically insulating material and can contain silicon and/or a ceramic material for this purpose.

The p-side connection location 12 and the n-side connection location 13 are arranged at the underside 11b of the main body 1. The connection locations 12, 13 are electrically conductively connected to the structured conductive layer 14 at the top side of the carrier in each case via a via 17. In this case, the structured electrically conductive layer 14 is subdivided into a first region 14a, which is electrically conductively connected to the n-side connection location 13, and into the second region 14b, which is electrically conductively connected to the p-side connection location 12. In the plan view in FIG. 2B it can be discerned that the second region 14b can be enclosed for example by the first region 14a. The connection locations and the structured electrically conductive layer 14 preferably contain a highly electrically conductive metal such as gold, for instance.

The structured electrically conductive layer 14 therefore distributes the current impressed through the connection locations 12, 13 at the top side 11a of the main body.

An electrically conductive structured carrier-side connecting means layer 15 is arranged at that side of the structured electrically conductive layer 14 which faces away from the main body 11. The carrier-side connecting means layer 15 is in electrically conductive contact with the structured conductive layer 14 in places. In other regions, a passivation material 16 that is electrically insulating is arranged between the structured carrier-side connecting means layer 15 and the structured electrically conductive layer 14. The connecting means layer contains for example a solder material such as, for instance, gold and/or tin. The passivation material can be formed with silicon dioxide and/or silicon nitride. Furthermore, it is possible to use a ceramic material such as, for instance, aluminum oxide and/or aluminum nitride as passivation material.

The passivation material 16 is in contact with the electrically conductive layer 14 only in the first region 14a, which is electrically conductively connected to the n-side connection location 13. At locations at which the carrier-side connecting means layer 15 is in direct contact with the electrically conductive layer 14, the thickness of the carrier-side connecting means layer 15 is chosen in such a way that the carrier 1 overall has a uniform thickness.

By means of the passivation material 16, a structured current-carrying arrangement is achieved in such a way that current is carried in a targeted manner to the contacts 26a, 26b of the optoelectronic structure 2. The optoelectronic structure 2 is electrically connected on the p-type side via the contact 26a, which is electrically conductively connected to the p-side connection location 12. The optoelectronic structure 2 is connected on the n-type side via the n-type contact 26b, which is electrically conductively connected to the n-side contact location 13. A distribution of the current from the n-side connection location 13 to the n-type contact 26b, which is embodied in a circular fashion in cross section in the present case, is not effected via structure-side structured electrically conductive layer 114, as shown in the alternative example in FIG. 1, but rather already at the carrier via the carrier-side structured electrically conductive layer 14. The connection locations and the contacts are formed for example with highly conductive metals such as gold, silver and/or aluminum.

In the present case, the optoelectronic structure 2 comprises a semiconductor layer sequence 21 based on a III-V compound semiconductor material, for example. A III-V compound semiconductor material comprises at least one element from the third main group, such as B, Al, Ga, In, for example, and an element from the fifth main group, such as N, P, As, for example. In particular, the term "III-V compound semiconductor material" encompasses the group of the binary, ternary or quaternary compounds which contain at least one element from the third main group and at least one element from the fifth main group, for example nitride and phosphide compound semiconductors. Such a binary, ternary or quaternary compound can additionally comprise for example one or more dopants for p-type doping and n-type doping and additional constituents.

The semiconductor layer sequence 21 comprises a p-doped p-type side 21a, an n-doped n-type side 21b and an active region 21c arranged between the two sides. A mirror layer 22 is arranged at that side of the optoelectronic structure 2 which faces the carrier 1, which mirror layer can consist of two or more layers. In this case, the mirror layer 22 is applied to the p-type side 21a of the semiconductor layer sequence 21 and serves for making contact with the semiconductor layer sequence 21 on the p-type side. The mirror layer 21 contains silver, for example.

For making contact with the n-type side 21b of the semiconductor layer sequence 21 on the n-type side, the optoelectronic structure 2 has structure-side vias 27, which are filled with material of the structure-side connecting means layer 25, for example, and make contact with the semiconductor layer sequence 21 at the n-type contacts 26b.

At the side facing the carrier, the optoelectronic structure 2 has a structured structure-side connecting means layer 25 comprising an n-type region 25b, which is electrically conductively connected to the n-type side 2 lb of the semiconductor layer sequence 21. Furthermore, the structure-side connecting means layer 25 has a p-type region 25a, which is electrically conductively connected to the mirror layer 22 and thereby to the p-type side 21a of the semiconductor layer sequence 21.

In this case, the n-type region 25b of the structure-side connecting means layer has no overlap with the mirror layer 22 in a vertical direction R—for example perpendicular to the main direction of extent of the active region 21c—and in the lateral direction perpendicular thereto. Rather, that part of the structure-side connecting means layer 25 which overlaps in a vertical direction is the p-type region 25a, such that the potential difference ΔU=0. In this way, it is possible to dispense with the relatively thick passivation layer 24 and to separate the mirror layer 22 from the connecting means layer 25 merely by the thinner passivation layer 23. In the extreme case, in the region of the mirror layer 22, a passivation material between the mirror layer 22 and the structure-side connecting means layer 25 can also be completely dispensed with.

In other words, in the exemplary embodiment in FIGS. 2A and 2B, a double-layer metallization is dispensed with at the optoelectronic structure 2, whereas it is situated at the carrier 1, where the connecting means layer 15 is electrically insulated from the conductive layer 13 in places by passivation material 16. The wiring for carrying current to the n-type contact 26b takes place at the carrier and the connecting means layer 25, for example a solder metal, carries the p-type polarity for the most part, that is to say in the p-type region 25a. The large-area mirror layer 22 is thus at the same potential as the connecting means layer 25 and the passivation layers 23, 24 present are electrically hardly loaded in this way. Although such a loading of the passivation material 16 occurs on the side of the carrier 1, there the passivation material 16 is applied only to planar areas, that is to say that no topography is present there, and the passivation material 16 on the carrier side can therefore be loaded to a greater extent.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102011012924.3, the disclosure content of which is hereby incorporated by reference.

The invention claimed is:

1. A carrier for an optoelectronic structure comprising:
an, in particular electrically insulating, main body;
at least one n-side connection location at an underside of the main body;
at least one p-side connection location at the underside of the main body;
a structured electrically conductive layer at the top side of the main body situated opposite the underside; and
a structured and electrically conductive carrier-side connecting means layer at that side of the structured electrically conductive layer which faces away from the main body,
wherein
the structured electrically conductive layer is electrically conductively connected to the n-side connection location in a first region,
the structured electrically conductive layer is electrically conductively connected to the p-side connection location in a second region,
the first region and the second region of the electrically conductive layer are electrically insulated from one another,
the carrier-side connecting means layer is in direct contact with the electrically conductive layer in places, and
in places an electrically insulating passivation material is arranged between the electrically conductive layer and the carrier-side connecting means layer,
wherein the passivation material is arranged in places between the electrically conductive layer and the carrier-side connecting means layer,
wherein the passivation material is in direct contact with the electrically conductive layer and the connecting means layer,
wherein at least one region of the carrier-side connecting means layer is present in which the carrier-side connecting means layer is only mechanically connected to the electrically conductive layer,
wherein the mechanical connection is imparted by the electrically insulating passivation material, and
wherein in said at least one region there is no electrically conductive contact between the carrier-side connecting means layer of the electrically conductive layer.

2. The carrier according to claim 1, wherein the passivation material is in direct contact with the electrically conductive layer exclusively in the first region.

3. The carrier according to claim 1, wherein the connection locations are electrically conductively connected to the electrically conductive layer by means of in each case at least one via, and
wherein the vias extend through the main body from the underside to the top side of the main body.

4. The carrier according to claim 1, wherein the main body is formed with silicon or a ceramic material.

5. An optoelectronic semiconductor chip comprising a carrier, said carrier comprising:
an, in particular electrically insulating, main body;
at least one n-side connection location at an underside of the main body;
at least one p-side connection location at the underside of the main body;
a structured electrically conductive layer at the top side of the main body situated opposite the underside;
a structured and electrically conductive carrier-side connecting means layer at that side of the structured electrically conductive layer which faces away from the main body,
wherein
the structured electrically conductive layer is electrically conductively connected to the n-side connection location in a first region,
the structured electrically conductive layer is electrically conductively connected to the p-side connection location in a second region,
the first region and the second region of the electrically conductive layer are electrically insulated from one another,
the carrier-side connecting means layer is in direct contact with the electrically conductive layer in places, and
in places an electrically insulating passivation material is arranged between the electrically conductive layer and the carrier-side connecting means layer;
an optoelectronic structure, which is electrically conductively and mechanically connected to the carrier by means of the carrier-side connecting means layer; and
a structured and electrically conductive structure-side connecting means layer, which is in direct contact with the carrier-side connecting means layer, wherein
- the two connecting means layers are mechanically fixedly connected to one another,
- the structure-side connecting means layer has at least one p-type region which is electrically conductively connected to the p-side connection location,
- the structure-side connecting means layer has at least one n-type region which is electrically conductively connected to the n-side connection location, and
- the n-type regions of the structure-side connecting means layer and a mirror layer, which is provided for reflecting electromagnetic radiation generated in an active region, do not overlap one another.

6. The optoelectronic semiconductor chip according to claim 5, wherein the optoelectronic structure comprises the following components:
- a semiconductor layer sequence having the active region;
- a mirror layer, which is electrically conductively connected to a p-type side of the semiconductor layer sequence; and
- at least one structure-side via which makes electrically conductive contact with an n-type side of the semiconductor layer sequence and extends from the p-type side through the active region as far as the n-type side.

7. The optoelectronic semiconductor chip according to claim 5, wherein the passivation material is arranged in places between the electrically conductive layer and the carrier-side connecting means layer,
- wherein the passivation material is in direct contact with the electrically conductive layer and the connecting means layer,
- wherein at least one region of the carrier-side connecting means layer is present in which the carrier-side connecting means layer is only mechanically connected to the electrically conductive layer, and
- wherein the mechanical connection is imparted by the electrically insulating passivation material and in said at least one region there is no electrically conductive contact between the carrier-side connecting means layer of the electrically conductive layer.

8. The optoelectronic semiconductor chip according to claim 7, wherein the passivation material is in direct contact with the electrically conductive layer exclusively in the first region.

9. The optoelectronic semiconductor chip according to claim 5, wherein the connection locations are electrically conductively connected to the electrically conductive layer by means of in each case at least one via, and
- wherein the vias extend through the main body from the underside to the top side of the main body.

10. The optoelectronic semiconductor chip according to claim 5, wherein the main body is formed with silicon or a ceramic material.

11. The optoelectronic semiconductor chip according to claim 5, wherein the carrier has a uniform thickness.

12. A carrier for an optoelectronic structure comprising:
- an, in particular electrically insulating, main body;
- at least one n-side connection location at an underside of the main body;
- at least one p-side connection location at the underside of the main body;
- a structured electrically conductive layer at the top side of the main body situated opposite the underside; and
- a structured and electrically conductive carrier-side connecting means layer at that side of the structured electrically conductive layer which faces away from the main body, wherein
- the structured electrically conductive layer is electrically conductively connected to the n-side connection location in a first region,
- the structured electrically conductive layer is electrically conductively connected to the p-side connection location in a second region,
- the first region and the second region of the electrically conductive layer are electrically insulated from one another,
- the carrier-side connecting means layer is in direct contact with the electrically conductive layer in places,
- in places an electrically insulating passivation material is arranged between the electrically conductive layer and the carrier-side connecting means layer,
- the passivation material is arranged in places between the electrically conductive layer and the carrier-side connecting means layer,
- the passivation material is in direct contact with the electrically conductive layer and the connecting means layer,
- at least one region of the carrier-side connecting means layer is present in which the carrier-side connecting means layer is only mechanically connected to the electrically conductive layer,
- the mechanical connection is imparted by the electrically insulating passivation material and in said at least one region there is no electrically conductive contact between the carrier-side connecting means layer of the electrically conductive layer, and
- the carrier has a uniform thickness.

* * * * *